(12) United States Patent
Suzuki

(10) Patent No.: US 7,394,106 B2
(45) Date of Patent: Jul. 1, 2008

(54) ELECTRO-OPTICAL DEVICE HAVING A MICROLENS LAYER WITH A THICKNESS DEFINED BY SUPPORTING BODIES INTERPOSED BETWEEN THE TWO SUBSTRATES

(75) Inventor: Tomio Suzuki, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 357 days.

(21) Appl. No.: 11/148,346

(22) Filed: Jun. 9, 2005

(65) Prior Publication Data
US 2005/0274969 A1    Dec. 15, 2005

(30) Foreign Application Priority Data

Jun. 11, 2004  (JP)  ............................. 2004-173944
Feb. 21, 2005  (JP)  ............................. 2005-043512
May 13, 2005  (JP)  ............................. 2005-140730

(51) Int. Cl.
*H01L 31/0232*    (2006.01)

(52) U.S. Cl. .................. 257/98; 257/432; 257/E33.068
(58) Field of Classification Search ................ 349/95
See application file for complete search history.

(56) References Cited

U.S. PATENT DOCUMENTS

| 6,618,200 | B2 | 9/2003 | Shimizu et al. |
| 6,628,353 | B2 * | 9/2003 | Nakamura ................... 349/95 |
| 6,894,840 | B2 | 5/2005 | Yamanaka et al. |
| 6,985,297 | B2 | 1/2006 | Yamanaka et al. |
| 6,985,298 | B2 | 1/2006 | Yamanaka et al. |
| 6,989,933 | B2 | 1/2006 | Yamanaka et al. |
| 6,992,832 | B2 | 1/2006 | Yamanaka et al. |
| 6,995,916 | B2 | 2/2006 | Yamanaka et al. |
| 2002/0021386 | A1 | 2/2002 | Yotsuya et al. |
| 2005/0057705 | A1 | 3/2005 | Yamanaka et al. |
| 2006/0187379 | A1 | 8/2006 | Yamanaka et al. |

FOREIGN PATENT DOCUMENTS

CN    1477409 A    2/2004
JP    A 2003-014907    1/2003

* cited by examiner

*Primary Examiner*—Stephen W Smoot
(74) *Attorney, Agent, or Firm*—Oliff & Berridge, PLC

(57) ABSTRACT

An electro-optical device includes first and second substrates that face each other, support bodies that are interposed between both substrates so as to define a gap between both substrates, and a microlens layer that is formed between both substrates. The first substrate is a lens glass substrate that has a plurality of concave portions and the second substrate is a cover glass substrate that faces the first substrate. A thickness of the microlens layer is defined by the support bodies.

9 Claims, 10 Drawing Sheets

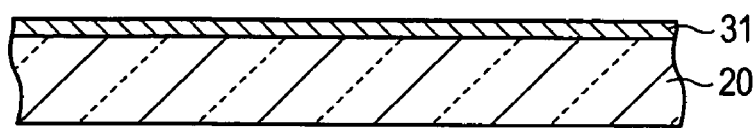
FIG. 2A
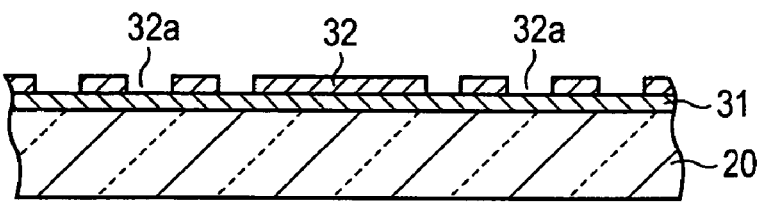
FIG. 2B
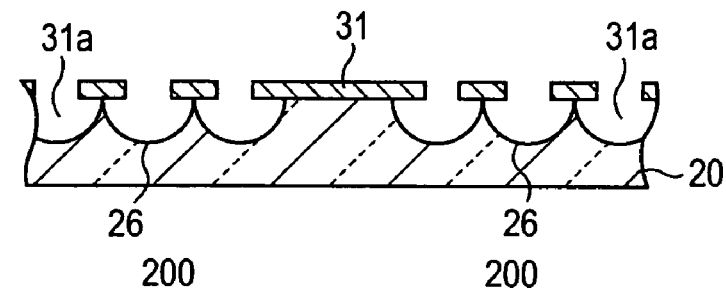
FIG. 2C
FIG. 2D
FIG. 2E
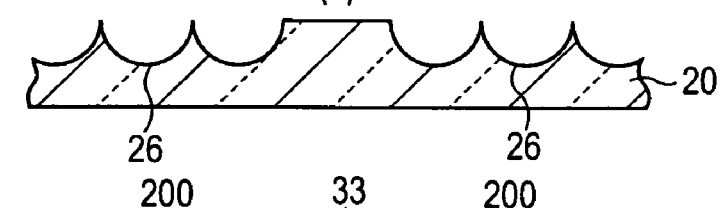
FIG. 2F
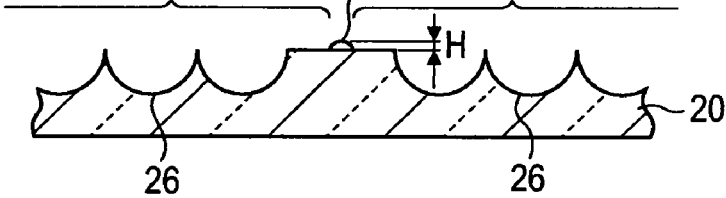
FIG. 2G
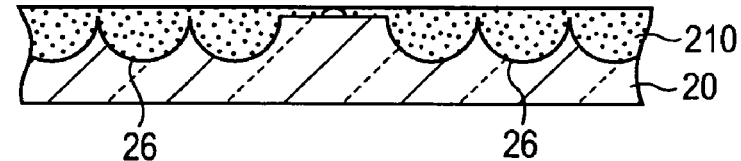
FIG. 2H
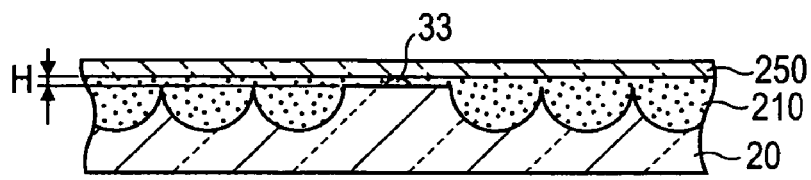
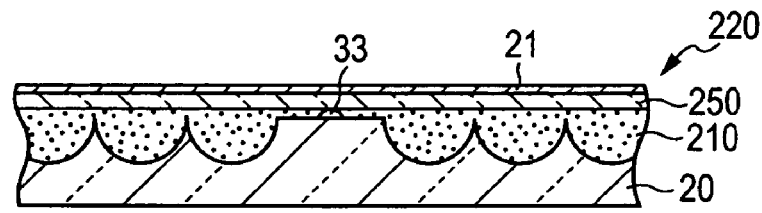

ELECTRO-OPTICAL DEVICE HAVING A MICROLENS LAYER WITH A THICKNESS DEFINED BY SUPPORTING BODIES INTERPOSED BETWEEN THE TWO SUBSTRATES

BACKGROUND OF THE INVENTION

1. Technical Field

The present invention relates to an electro-optical device, in which a gap between a pair of substrates facing each other is defined by support bodies made of an adhesive ejected from a liquid droplet ejection device main body, to a method of manufacturing an electro-optical device, and to an electronic apparatus using such an electro-optical device.

2. Related Art

A projection-type display device, such as a liquid crystal projector, or the like, has a configuration in which light irradiated from a light source is optically modulated by an electro-optical device serving as a light valve, and modulated light is projected to the front in a magnified scale. As a liquid crystal device that is an example of the electro-optical device, an active-matrix-type liquid crystal display is widely used in order to provide increased display quality.

In the active-matrix-type liquid crystal device, pixels having pixel electrodes are formed in a matrix shape on an active matrix substrate. Further, for each pixel, an active element, such as a thin film transistor (TFT) or the like, is formed.

In such an active-matrix-type liquid crystal device, a high contrast ratio is easily obtained, but a TFT, a capacitive element, and the like need to be provided for each pixel, which results in a problem in that a sufficient aperture ratio is difficult to obtain. Further, when intense light is irradiated onto a channel region or a drain terminal of the TFT, photocurrent is generated, which causes a change in characteristics of the TFT.

Therefore, a configuration has been adopted in which, among the pair of substrates constituting the liquid crystal device, a light-shielding film (black matrix) is formed on a counter substrate, on which light is incident, in order to enhance the contrast and prevent intense light from being irradiated onto the TFT.

Further, a technique has been adopted in which a layer having a plurality of minute microlenses (microlens layer) is formed on the counter substrate and incident light, which is reflected or shielded by the light-shielding layer to be lost, is condensed to openings of the pixels with the respective microlenses, thereby increasing the amount of transmitted light.

A method of manufacturing such a counter substrate with microlenses is disclosed in, for example, Japanese Unexamined Patent Application Publication No. 2003-14907.

In the technique disclosed in Japanese Unexamined Patent Application Publication No. 2003-14907, first, a masking member is formed on a large lens glass substrate serving as a base and a resist pattern is formed on the masking member. Next, through etching with the resist pattern as a mask, openings corresponding to the plurality of microlenses are formed in the masking member. Subsequently, the resist pattern is removed.

Next, wet etching or isotropic dry etching is performed on the large lens glass substrate from the masking member to form a plurality of concave portions for the microlenses on the lens glass substrate. Then, the masking member is removed.

Subsequently, an adhesive made of a transparent resin having high refractive index is coated on the surface where the plurality of concave portions for the microlenses are formed. Then, a cover glass substrate is integrally bonded onto the adhesive.

Subsequently, on the surface of the cover glass substrate, color filters and the light-shielding film (BM: black matrix) among the pixels are formed. In addition, a common electrode made of a transparent conductive material, such as ITO (Indium Tin Oxide), is formed and an alignment film is formed on the common electrode. Accordingly, a large substrate having a plurality of chip-like counter substrates is formed.

In order to increase the amount of transmitted light from the opening of each pixel with the microlenses, in the molding of the microlens layer, it is necessary to precisely set the thickness of the microlens layer. In the molding of the microlens layer, in order to precisely set the thickness thereof, after the plurality of concave portions for the microlenses are formed on the surface of the lens glass substrate, dots of adhesive in which a gap material is mixed are drawn around the periphery of the counter substrate at predetermined internals with a dispenser or the like. Then, after the adhesive is drawn on the lens glass substrate, the cover glass substrate is bonded thereto. At this time, the gap between the cover glass substrate and the lens glass substrate is defined by the gap material and the thickness of the microlens layer is maintained to be constant. This technique has been known in the related art.

As described above, the plurality of counter substrates are formed on the large substrate. In order to increase the number of the counter substrates that can be cut out of one large substrate, the interval between the counter substrates to be formed on the large substrate needs to be small.

However, if the interval between the counter substrates is reduced, it is difficult to draw the gap material on the boundary lines between the counter substrates with the dispenser or the like. The gap material may be drawn only on the circumference of the lens glass substrate. As a result, as regards the gap between the lens glass substrate and the cover glass substrate, the deflection amount may be gradually increased from the outer circumference to the central portion and thus a deviation in thickness of the microlens layer corresponding to that amount may easily occur. Then, uniformity of the products is difficult to maintain.

The deviation in thickness of the microlens layer in one large substrate falls normally within an acceptable error range and thus the deviation does not cause product defects. However, in recent years, with demands for higher image quality, the thickness of the microlens layer must be set with higher precision. Accordingly, such demands result in defective products.

SUMMARY

An advantage of the invention is that it provides to an electro-optical device that can uniformize the thickness of a microlens layer to realize uniform lens performance and that can sufficiently cope with demands for higher image quality, a method of manufacturing such an electro-optical device, and an electronic apparatus using such an electro-optical device.

According to a first aspect of the invention, an electro-optical device includes first and second substrates that face each other, and support bodies that are provided between both substrates so as to define a gap between both substrates. The first substrate is a lens glass substrate that has a plurality of concave portions and the second substrate is a cover glass substrate that faces the first substrate. A microlens layer is formed between both substrates and a thickness of the microlens layer is defined by the support bodies.

According to this configuration, the gap between the lens glass substrate and the cover glass substrate is defined by the support bodies. Therefore, the support bodies can be formed on the boundary of adjacent concave portions. As a result, the thickness of the microlens layer can be made uniform, resulting in uniform lens performance.

In the electro-optical device according to the first aspect of the invention, it is preferable that the support bodies are made of a curable material ejected from a liquid droplet ejection unit.

According to this configuration, the support bodies are made of the curable material ejected from the liquid droplet ejection unit. Therefore, the support bodies can be formed in narrow areas with high precision.

In the electro-optical device according to the first aspect of the invention, it is preferable that a gap material that defines a distance between both substrates is mixed in the supporting bodies.

According to this configuration, the gap material is mixed in the support bodies. Therefore, the distance between both substrates can be defined more precisely.

According to a second aspect of the invention, a method of manufacturing an electro-optical device includes forming concave portions for microlenses in at least one of opposing surfaces of first and second substrates that face each other, drawing a set amount of a curable material on one of the opposing surfaces of both substrates that face each other, curing the drawn curable material to form support bodies each having a set height, filling an adhesive for forming a microlens layer on the substrate where the concave portions are formed, and bonding the opposing surface of the other substrate to the opposing surface of the one substrate via the adhesive to define a gap between both opposing surfaces by the support bodies.

According to this configuration, first, the concave portions for the microlenses are formed on at least one of the opposing surfaces of the first and second substrates that face each other. Next, the set amount of the curable material is drawn on one of the opposing surfaces of both substrates that face each other, and then the drawn curable material is cured to form the support bodies each having the set height. Next, the adhesive for forming the microlens layer is filled on the substrate where the concave portions are formed. Subsequently, the opposing surface of the other substrate and the opposing surface of the one substrate are bonded via the adhesive. At this time, the gap between both opposing surfaces is defined by the support bodies. Since the gap between both substrates is regulated by the support bodies, the thickness of the microlens layer that is formed between both substrates can be made uniform, resulting in uniform lens performance.

In the method of manufacturing an electro-optical device according to the second aspect of the invention, it is preferable that a gap material that defines a distance between both substrates is mixed in the curable material.

According to this configuration, the gap material that defines the distance between both substrates is mixed in the curable material. With the gap material, the distance between both substrates can be defined precisely.

According to a third aspect of the invention, a method of manufacturing an electro-optical device includes forming concave portions for microlenses in at least one of opposing surfaces of first and second substrates that face each other, spraying a gap material on one of the opposing surfaces of both substrates that face each other, drawing a set amount of a curable material at locations, where support bodies are to be formed, of the opposing surface on which the gap material is sprayed, curing the drawn curable material, in a state that the gap material is incorporated into the curable material, to form the support bodies each having a set height, removing the gap material excluding the gap material incorporated into the curable material, filling an adhesive for forming a microlens layer on the substrate where the concave portions are formed, and bonding the opposing surface of the other substrate to the opposing surface of the one substrate via the adhesive to define a gap between both opposing surfaces by the support bodies.

According to this configuration, first, the concave portions for the microlenses are formed on at least one of the opposing surfaces of the first and second substrates that face each other. Next, the gap material is sprayed on one of the opposing surfaces of both substrates that face each other. Subsequently, the set amount of the curable material is drawn at the locations, where the support bodies are to be formed, of the opposing surface on which the gap material is sprayed. Subsequently, the drawn curable material is cured, in a state that the gap material is incorporated into the curable material, to form the support bodies each having the set height, and then the gap material excluding the gap material incorporated into the curable material are removed. Next, the adhesive for forming the microlens layer is filled on the substrate where the concave portions are formed. Subsequently, the opposing surface of the other substrate and the opposing surface of the one substrate are bonded via the adhesive. At this time, the gap between both opposing surfaces is defined by the support bodies. Since the gap between the opposing surfaces of the first and second substrates is defined by the support bodies into which the gap material is incorporated, the gap between both substrates can be set by the support bodies with higher precision.

In the method of manufacturing an electro-optical device according to the third aspect of the invention, it is preferable that, in the drawing of the curable material, the set amount of the curable material, which is diluted by a solution, is ejected from a liquid droplet ejection device main body and is drawn on the one of the opposing surfaces of both substrates that face each other.

According to this configuration, since the support bodies are made of the adhesive ejected from the liquid droplet ejection device main body, the support bodies can be formed in the narrow areas with high precision.

According to a fourth aspect of the invention, an electro-optical device includes a first substrate, support bodies that are formed on the first substrate, and a transparent material layer that is formed to reach the same height as each support body on the first substrate.

According to this configuration, the height of the transparent material layer is defined by the support bodies, and thus the height of the transparent material layer can be set with high precision.

In the electro-optical device according to the fourth aspect of the invention, it is preferable that the first substrate is a lens glass substrate that has a plurality of concave portions. The transparent material layer may be a microlens layer that has a refractive index different from that of the lens glass substrate. Further, a thickness of the microlens layer may be defined by the support bodies.

According to this configuration, the thickness of the microlens layer formed on the lens glass substrate is defined by the support bodies. Therefore, the thickness of the transparent material layer can be made uniform with high precision, resulting in uniform lens performance. Further, the sufficient thickness of the microlens layer can be secured, such that a cover glass does not need to be formed. As a result, the surface state of the microlens layer can be improved and low cost can be achieved.

The electro-optical device according to the fourth aspect of the invention may further include a protective film that is formed on the surface of the transparent material layer.

According to this configuration, the protective film is formed on the surface of the transparent material layer, and thus adhesiveness to an overlying layer, such as a light-shielding layer or the like, that is formed on the transparent material layer can be enhanced.

In the electro-optical device according to the fourth aspect of the invention, it is preferable that a gap material that defines the thickness of the transparent material layer is mixed in the support bodies.

According to this configuration, since the gap material is mixed in the support bodies, the thickness of the transparent material layer can be defined more precisely.

In the electro-optical device according to the fourth aspect of the invention, it is preferable that the transparent material layer is made of a transparent resin.

According to this configuration, since the transparent material layer is made of the transparent resin, a light weight can be realized and the layer can be easily formed.

According to a fifth aspect of the invention, a method of manufacturing an electro-optical device includes drawing a set amount of a curable material on one surface of a first substrate, curing the curable material to form support bodies each having a set height, and filling a transparent material on the substrate, on which the support bodies are formed, to reach the same height as each support body and curing the transparent material.

According to this configuration, first, the set amount of the curable material is drawn on one surface of a first substrate. Next, the curable material is cured to form support bodies each having a set height. Subsequently, the transparent material is filled on the substrate, on which the support bodies are formed, to reach the same height as each support body and is cured. Since the height of the transparent material can be defined by the support bodies, the height of the transparent material can be defined with high precision.

According to a sixth aspect of the invention, a method of manufacturing an electro-optical device includes forming concave portions for microlenses on one surface of a first substrate, drawing a set amount of a curable material on the substrate on which the concave portions are formed, curing the curable material to form support bodies each having a set height, and forming a transparent material layer, which has a refractive index different from that of the first substrate, on the substrate, on which the concave portions are formed, to reach the same height as each support body, thereby forming a microlens layer.

According to this configuration, first, the concave portions for the microlenses are formed on one surface of the first substrate. Next, the set amount of the curable material is drawn on the substrate on which the concave portions are formed. Subsequently, the curable material is drawn and cured to form support bodies each having a set height. Then, the transparent material layer, which has a refractive index different from that of the first substrate, is formed on the substrate, on which the concave portions are formed, to reach the same height as each support body, thereby forming the microlens layer. Since the height of the transparent material serving as a microlens layer can be defined by the support bodies, the thickness of the microlens layer can be set with high precision.

In the method of manufacturing an electro-optical device according to the sixth aspect of the invention, it is preferable that the forming of the transparent material layer includes filling a transparent material on the substrate on which the concave portions are formed, adhering a flat plate to a surface of the transparent material to press the transparent material to reach the same height as each support body to define a thickness of the transparent material by the support bodies, and curing the transparent material to form the transparent material layer.

According to this configuration, first, the transparent material is filled on the substrate on which the concave portions are formed. Next, the flat plate is adhered to the surface of the transparent material to press the transparent material to reach the same height as each support body. At this time, the thickness of the transparent material is defined by the support bodies. Then, the transparent material is cured to form the transparent material layer. Since the thickness of the transparent material layer formed on the first substrate is defined by support bodies, the thickness of the transparent material layer can be made uniform with high precision.

The method of manufacturing an electro-optical device according to the sixth aspect of the invention may further include forming a protective film on the surface of the transparent material layer.

According to this configuration, since the protective film is formed on the surface of the transparent material layer, the adhesiveness to the overlying layer, such as the light-shielding layer or the like, that is formed on the transparent material layer can be enhanced.

In the method of manufacturing an electro-optical device according to the sixth aspect of the invention, a gap material that defines a thickness of the transparent material layer may be mixed in the curable material.

According to this configuration, since the gap material that defines the thickness of the transparent material layer is mixed in the curable material, the thickness of the transparent material layer can be defined more precisely by the gap material.

In the method of manufacturing an electro-optical device according to the fifth aspect of the invention, it is preferable that, in the drawing of the curable material, the curable material, which is diluted by a solution, is ejected from a liquid droplet ejection device main body to be drawn.

According to this configuration, the curable material is ejected from the liquid droplet ejection device to be drawn and thus the curable material can be drawn in the narrow area with high precision.

In the method of manufacturing an electro-optical device according to the fifth aspect of the invention, it is preferable that the transparent material is a transparent resin.

According to this configuration, since the transparent material is the transparent resin, the light weight can be realized and also manufacturing can be easily performed.

In the method of manufacturing an electro-optical device according to the sixth aspect of the invention, it is preferable that the transparent material layer is made of a transparent resin.

According to this configuration, since the transparent material layer is made of the transparent resin, the light weight can be realized and the layer can be easily formed.

Further, according to a seventh aspect of the invention, an electronic apparatus includes the electro-optical device according to the first aspect of the invention.

According to this configuration, the electro-optical device according to the first aspect of the invention is mounted on the electronic apparatus and thus an electronic apparatus having a higher quality can be provided.

BRIEF DESCRIPTION OF THE DRAWINGS

The invention will be described with reference to the accompanying drawings, wherein like numbers reference like elements, and wherein:

FIG. 2A is a process view showing a manufacturing method of a large substrate in the first embodiment of the invention;

FIG. 2B is a process view showing the manufacturing method of the large substrate in the first embodiment of the invention;

FIG. 2C is a process view showing the manufacturing method of the large substrate in the first embodiment of the invention;

FIG. 2D is a process view showing the manufacturing method of the large substrate in the first embodiment of the invention;

FIG. 2E is a process view showing the manufacturing method of the large substrate in the first embodiment of the invention;

FIG. 2F is a process view showing the manufacturing method of the large substrate in the first embodiment of the invention;

FIG. 2G is a process view showing the manufacturing method of the large substrate in the first embodiment of the invention;

FIG. 2H is a process view showing the manufacturing method of the large substrate in the first embodiment of the invention;

DESCRIPTION OF THE EMBODIMENTS

Hereinafter, embodiments of the invention will be described with reference to the drawings.

First Embodiment

FIGS. 1 to 7 relate to the first embodiment of the invention. A substrate with a microlens array may be used for various optical apparatuses. In the present embodiment, for example, the substrate with the microlens array is applied to a counter substrate of a liquid crystal device serving as a light valve of a projection-type display device, which is an example of an electronic apparatus.

Figure 1:
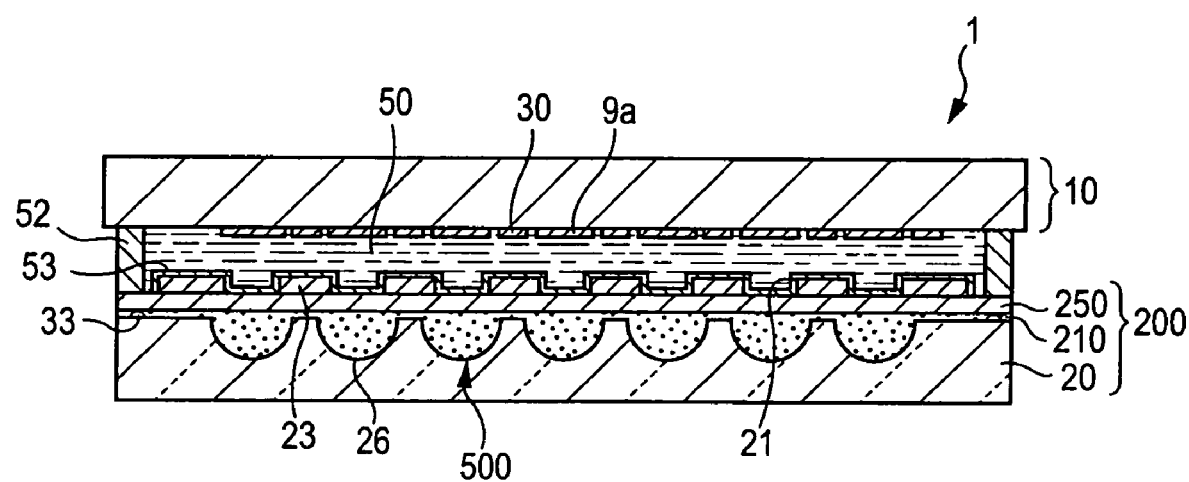
FIG. 1 is a cross-sectional view of a liquid crystal device according to a first embodiment of the invention.

FIG. 1 is a cross-sectional view of a liquid crystal device. The overall configuration of a liquid crystal device, which is an example of an electro-optical device, will be described with reference to FIG. 1. Here, for example, a TFT active-matrix-type liquid crystal device having a built-in driving circuit will be described.

The liquid crystal device 1 of the present embodiment has a counter substrate 200 and an active matrix substrate 10 made of a quartz substrate, which are bonded to each other via a sealing material 52 with a space defining a predetermined gap. Liquid crystal 50, which is an example of an electro-optical material, is sealed into the space.

The counter substrate 200 is a substrate with a microlens array on which a plurality of microlenses 500 are formed. In order to form such microlenses 500, the counter substrate 200 has a structure in which a lens glass substrate 20, serving as a first substrate, made of a quartz substrate and a cover glass substrate 250 serving as a second substrate are bonded to each other via a microlens layer 210.

The microlens layer 210 is made of a transparent adhesive having a refractive index different from that of the lens glass substrate 20. The adhesive is filled in substantially semicircular concave portions 26 formed on the lens glass substrate 20, thereby constituting the microlenses 500 that function as condenser lenses. Moreover, a resin material for the transparent adhesive includes an acryl-based resin, an epoxy-based resin, an acrylic epoxy-based resin, a vinyl-based resin, a thiourethane-based resin, or the like. In addition, if an ultraviolet curable resin is used, manufacturing is easily performed.

The microlenses 500 are formed in a matrix shape so as to condense incident light to pixel electrodes 9a that are formed on the active matrix substrate 10. Further, inside the formation region of the sealing material 52, a light-shielding layer 53 that defines an image display region is formed on the counter substrate 200 around that formation region.

On the active matrix substrate 10, after pixel switching TFTs 30 or wiring lines, such as scanning lines, data lines, capacitive lines, and the like are formed, an alignment film (not shown) that is subjected to a rubbing treatment is formed on the surfaces of the pixel electrodes 9a. In addition, a light-shielding layer 23 that faces the boundaries among the plurality of microlenses 500 and defines non-opening portions of pixels and a counter electrode 21 are formed on the cover glass substrate 250. An alignment film (not shown) that is subjected to a rubbing treatment is formed on the counter electrode 21. Moreover, the counter electrode 21 is made of, for example, a transparent conductive material, such as ITO. In addition, the respective alignment films are made of, for example, a transparent organic film, such as a polyimide film.

The counter substrate 200 is formed by being cut out in a chip shape from a large substrate. Hereinafter, the chip-like counter substrate and the large substrate are distinguished from each other by referring to them as the chip-like counter substrate 200 and the large substrate 220, respectively. In addition, a region (hereinafter, referred to as chip substrate region) where the chip-like counter substrate 200 is cut out is represented by the same reference numeral (200) as that of the chip-like counter substrate 200. For simplicity of explanation, the lens glass substrate 20 and the cover glass substrate 250 are represented by the same reference numerals as those in the large substrate prior to being cut out in the chip shapes.

Next, a manufacturing method of the large substrate 220 having such a configuration will be described with reference to process views of FIGS. 2A to 2H.

(a) On the large lens glass substrate 20 (see FIG. 3) that is cleaned in advance, a masking layer 31 that serves as a mask when the lens glass substrate 20 is etched is film-formed by a sputtering method, a chemical vapor deposition (CVD) method, or the like.

(b) A resist 32 is coated on the masking layer 31 and a resist pattern is formed in the resist 32 by a lithography method, or the like. This resist pattern is provided in order to form concave portions 26 in the lens glass substrate 20 in a subsequent process. Accordingly, openings 32a are disposed at locations corresponding to the concave portions 26 for the microlenses. Moreover, the concave portions 26 are formed in the respective regions of each of the chip substrate regions 200 facing the pixel electrodes 9a that are formed on the active matrix substrate 10.

Then, etching is performed with the resist 32 as a mask to pattern the masking layer 31, such that a plurality of openings 31a are formed in the masking layer 31.

(c) After the openings 31 are formed, the resist 32 is removed. Subsequently, wet etching or isotropic dry etching is performed on the lens glass substrate 20, such that the concave portions 26 are formed in the regions on the surface of the lens glass substrate 20 that are divided by the resist 32.

(d) When the masking layer 31 is removed, the concave portions 26 are formed in a predetermined arrangement for each chip substrate region 200 of the lens glass substrate 20.

Figure 3:
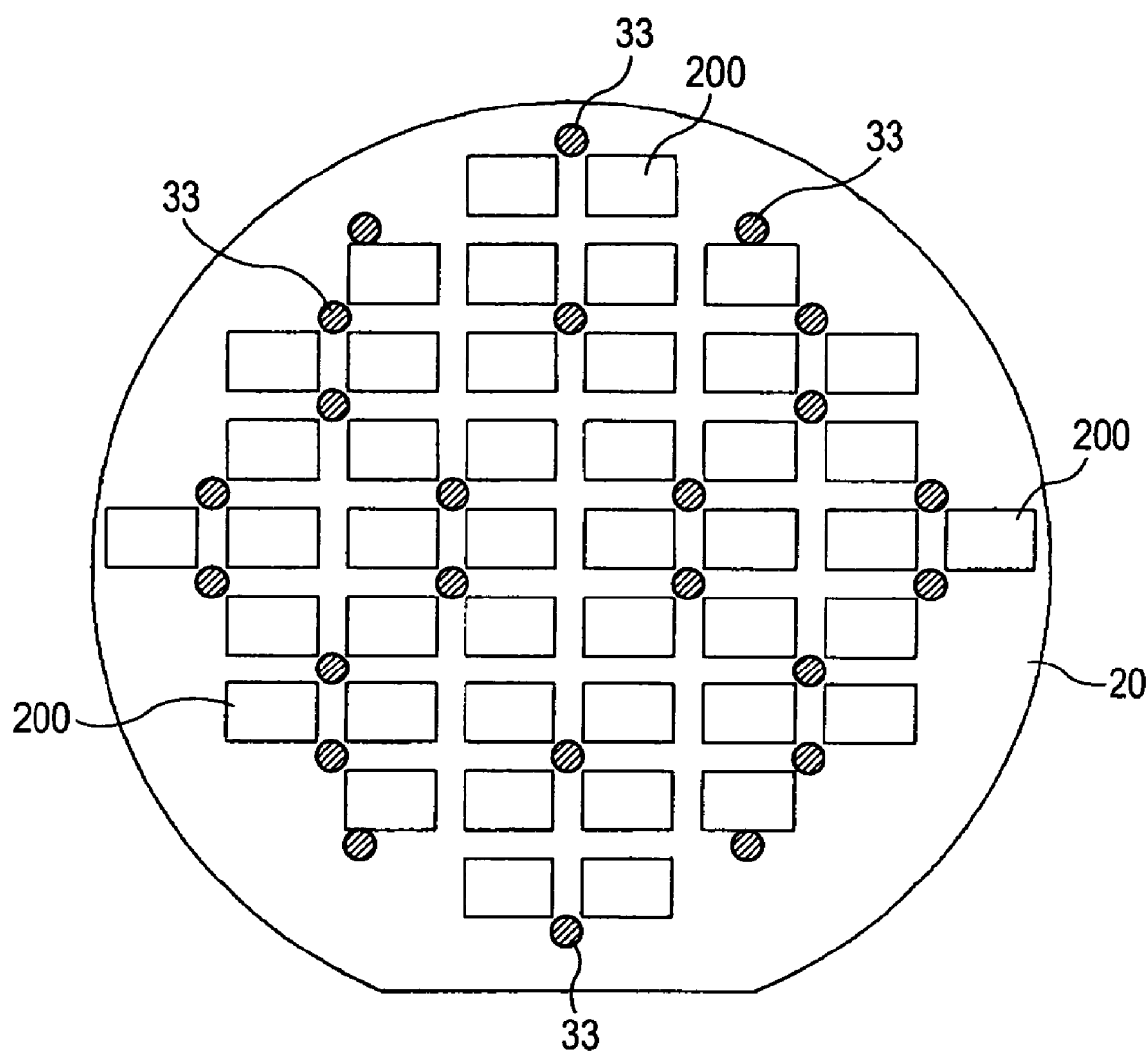
FIG. 3 is a plan view showing a state in which support bodies are drawn on a lens glass substrate.

(e) Support bodies 33, each having a height H, are drawn in the form of dots on the lens glass substrate 20. As shown in FIG. 3, the support bodies 33 are drawn near the boundary between adjacent chip substrate regions 200 on the lens glass substrate 20 and, if necessary, in an outer circumference of the lens glass substrate 20 and are cured. The support bodies 33 define a gap between the lens glass substrate 20 and the cover glass substrate 250. For this reason, the thickness of the microlens layer 210 is uniform to realize uniform lens performance. Various units for forming the support bodies 33 may be considered. The units for forming the support bodies 33 that are possible in the present embodiment will be described by way of examples described below.

(f) In order to form the microlens layer 210 on the lens glass substrate 20, an uncured adhesive (210) is coated. The adhesive (210) is made of a transparent resin having a high refractive index.

(g) The cover glass substrate 250 is mounted on the adhesive (210). The cover glass substrate 250 has the same shape as that of the lens glass substrate 20 shown in FIG. 3. The cover glass substrate 250 is entirely joined and pressed or adhered to the lens glass substrate 20 while a predetermined alignment is performed.

Next, the adhesive (210) is cured by the irradiation of ultraviolet rays, or the like. By doing so, the lens glass substrate 20 and the cover glass substrate 250 are joined with each other via the adhesive (210), and the height H between both glass substrates 20 and 250 is made constant by the support bodies 33 that exist on the lens glass substrate 20 in the form of dots. Therefore, the microlens layer 210 is formed by the adhesive (210).

Moreover, the method of curing the adhesive is not limited to the ultraviolet curing method but may be suitably selected according to the type or properties of the adhesive. For example, when a thermosetting adhesive is used as the adhesive, the adhesive can be cured by heat irradiation.

As shown in FIG. 3, the support bodies 33, each having the height H, exist near the boundary between adjacent chip substrate regions 200 of the lens glass substrate 20 and, if necessary, on the outer circumference of the lens glass substrate 20. Therefore, the height H between the lens glass substrate 20 and the cover glass substrate 250 can be made constant over the entire substrate. As a result, the thickness of the microlens layer 210 that is formed between both glass substrates 20 and 250 can be made uniform, resulting in uniform lens performance.

(h) The counter electrode 21 is formed on the cover glass substrate 250, such that the large substrate 220 is completed.

Figure 7:
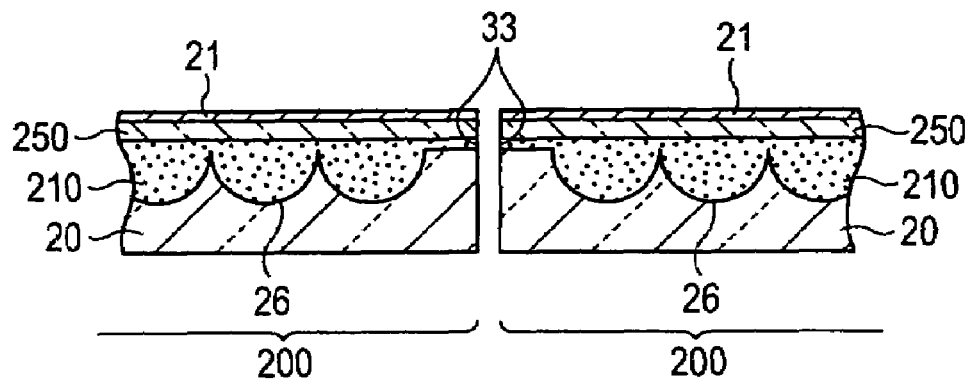
FIG. 7 is a process view showing a manufacturing method of chip-like counter substrates in the first embodiment of the invention.

Next, as shown in FIG. 7, a plurality of chip-like counter substrates 200 are cut out from the large substrate 220 through scribing, dicing, or the like. The support bodies 33 exist near the boundaries between adjacent chip substrate regions 200 in the form of dots. As shown in FIG. 1 or 7, though a remnant may exist in the circumference of each of the chip-like counter substrates 200, when the counter substrates 200 are cut out in the chip shapes by scribing or dicing, since the remnant is away from the pixel region, the image quality is hardly affected.

Examples of the unit that draws the support bodies 33 on the lens glass substrate 20 in the form of dots will now be specifically described with reference to FIGS. 4 to FIG. 6C.

FIRST EXAMPLE

Figure 4:
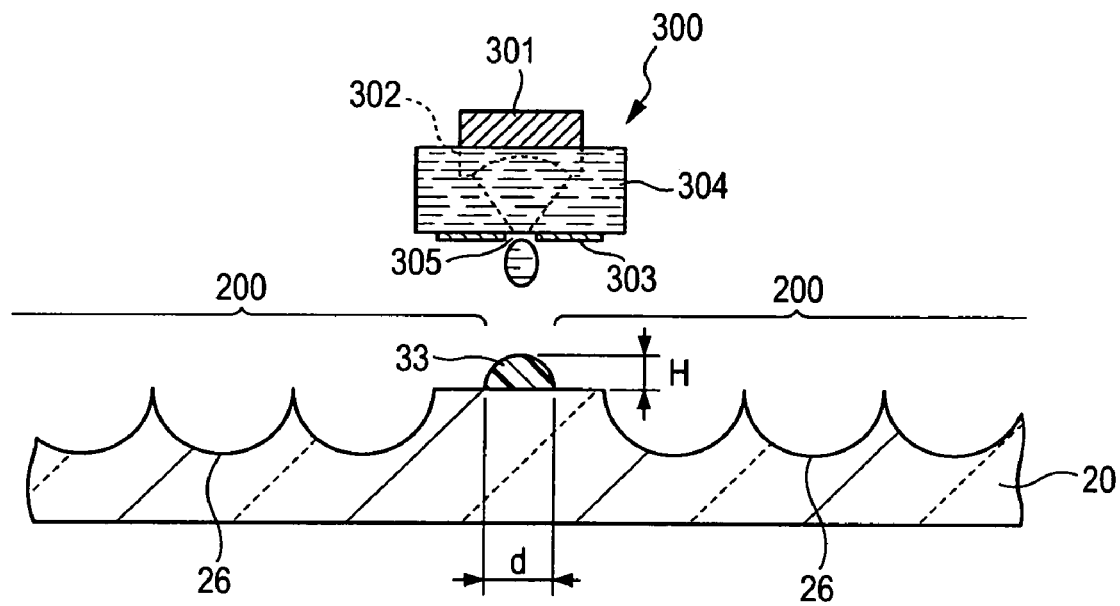
FIG. 4 is an expanded cross-sectional view showing essential parts according to a first example in the first embodiment of the invention.

A first example of the unit that draws the support bodies 33 on the lens glass substrate 20 in the form of dots will be specifically described with reference to FIG. 4. FIG. 4 is an expanded cross-sectional view showing essential parts in a state where the support bodies are drawn, according to the present example.

In the present example, a curable material forming the support bodies 33 is ejected by a predetermined amount onto the surface of the lens glass substrate 20 from the liquid droplet ejection device main body 300. When the curable material is attached to the lens glass substrate 20, the support bodies 33, each having the height H, are formed by surface tension.

Here, the configuration of a liquid droplet ejection main body 300 will be simply described. The liquid droplet ejection main body 300 corresponds to a head of an inkjet printer and has a piezoelectric element 301 that constitutes an ultrasonic wave generating section. Electrodes (not shown) are mounted on both surfaces of the piezoelectric element 301 and a concave lens (acoustic lens) 302 is adhered to the side through which the ejected liquid is supplied. In addition, a nozzle plate 303 is spaced at a predetermined gap from a concave surface of the concave lens 302. A liquid reservoir section 304 is formed in a space between the nozzle plate 303 and the concave lens 302.

The curable material for forming the support bodies 33 is stored in the liquid reservoir section 304 in a state in which the wettability of the curable material is lowered to a predetermined value with a solvent. In the present embodiment, as the curable material, a resin material, such as an epoxy-based resin and an acryl-based resin, is used. Preferably, a photocurable resin (by ultraviolet rays and infrared rays) or a thermosetting resin, which has low wettability, is used. Of course, the same transparent adhesive as that of the microlens layer 210 may be used.

Further, an ejection slot 305 through which the curable material is ejected is formed in the nozzle plate 303. The ejection slot 305 and the concave lens 302 are concentric.

If a high-frequency alternating current (AC) voltage is selectively applied to the piezoelectric element 301 from a high-frequency power control circuit (not shown) so as to generate an ultrasonic vibration, the vibration energy is converged to a surface of a liquid level of the liquid reservoir section 304, that is, the ejection slot 305, by the concave lens 302. Then, with the converged energy, the curable material stored in the liquid reservoir section 304 is ejected from the ejection slot 305 in minute liquid droplets. The liquid droplet ejection device main body 300 can eject a small amount of the liquid with high precision, and thus the support bodies 33 can be formed in extremely narrow areas with high precision.

According to such a configuration, when the support bodies 33 are drawn on the lens glass substrate 20, first, the ejection slot 305 of the liquid droplet ejection device main body 300 is moved to a location to be drawn in the form of dots (near the boundary between adjacent chip substrate regions 200 or, if necessary, on the outer circumference of the lens glass substrate 20).

Next, with the vibration of the piezoelectric element 301, the curable material that is supplied to the liquid reservoir section 304 in a state in which the wettability is lowered by the solution is ejected by a predetermined amount on the lens glass substrate 20 from the ejection slot 305.

After the solution is volatilized from the curable material ejected on the lens glass substrate 20, the support bodies 303, each having the height H, are formed by surface tension. Moreover, at that time, when the height H of each of the support bodies 33 does not reach the set value by one drawing operation, a new curable material is drawn thereon in the form of dots, to realize the previously set height H.

Subsequently, when the curable material is an ultraviolet curable resin, ultraviolet rays are irradiated onto the support bodies 33. Alternatively, when the curable material is a thermosetting resin, heat irradiation is performed on the support bodies 33. Then, the curable material is cured.

Since the support bodies 33 are formed with the curable material ejected from the liquid droplet ejection device main body 300, the support bodies 33 each having an extremely small diameter d (for example, about 0.1 to 5 mm) can be formed, as compared to the case in which drawing is performed with a dispenser or the like. For this reason, the support bodies 33 can be easily formed on the outer circumference of the lens glass substrate 20 and near the boundary between adjacent chip substrate regions 200.

As a result, the deviation in thickness of the microlens layer 210 is eliminated and thus a focus distance of each lens becomes constant. In addition, incident light, which is reflected or shielded by the light-shielding layer 23 to be lost, can be efficiently condensed to the openings of the respective pixels. Therefore, the amount of transmitted light can be further increased.

Further, since the height H of each of the support bodies 33 is set based on the nature of only the curable material ejected from the liquid droplet ejection device main body 300, ease of handling can be achieved, without adding other members.

Moreover, though the support bodies 33 are drawn with the liquid droplet ejection device in the form of dots in the present embodiment, the support bodies 33 may be made of a photo spacer. The photo spacer is a photosensitive resin material, such as photo resist or the like. In this case, after the resin material is coated at a predetermined thickness, the support bodies 33 are formed by photo etching.

SECOND EXAMPLE

Figure 5:
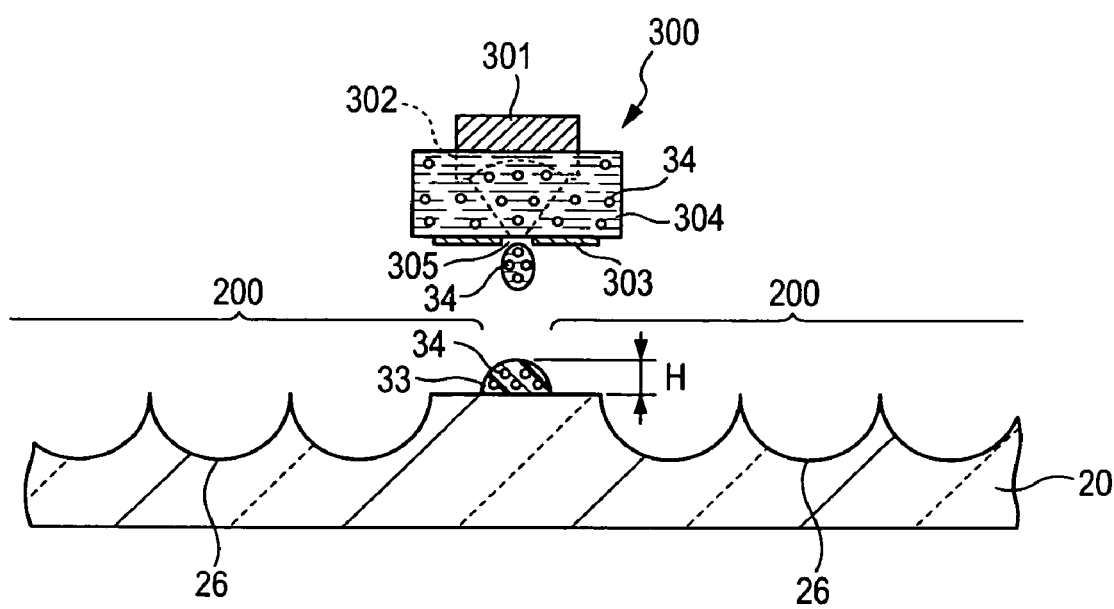
FIG. 5 is an expanded cross-sectional view showing essential parts according to a second example in the first embodiment of the invention.

A second example of the unit that draws the support bodies 33 on the lens glass substrate 20 in the form of dots will be specifically described with reference to FIG. 5.

In the first example, the height H of each of the support bodies 33 is set by surface tension of the curable material. In the present example, a curable material, in which gap materials 34 are mixed, is ejected from the liquid droplet ejection device main body 300 by a predetermined amount and is drawn on the lens glass substrate 20 in the form of dots, thereby forming the support bodies 33.

In the liquid reservoir section 304 of the liquid droplet ejection device main body 300, the curable material, which is diluted by a solution, and the gap materials 34 are supplied. The gap materials 34 are made of glass fibers, glass beads, or the like and are spheres each having a particle size of from 5 to 20 μm. For actual use, the particle size is determined according to the height H of each of the support bodies 33.

Moreover, in the liquid droplet ejection device main body 300, in addition to the piezoelectric element 301 that ejects the curable material by the predetermined amount, a vibrator that uniformly diffuses the curable material by vibrating the gap materials 34 at a resonance point is incorporated.

According such a configuration, when the support bodies 33 are drawn on the lens glass substrate 20 in the form of dots, first, the ejection slot 305 of the liquid droplet ejection device main body 300 is moved to a location to be drawn in the form of dots (near the boundary between adjacent chip substrate regions 200 or, if necessary, on the outer circumference of the lens glass substrate 20).

Next, with the vibration of the piezoelectric element 301, the curable material that is stored in the liquid reservoir section 304 while being diluted by the solution and in which the gap materials 34 is mixed is ejected by the predetermined amount on the lens glass substrate 20 from the ejection slot 305.

After the solution is volatilized from the curable material ejected on the lens glass substrate 20, the support bodies 303, each having the height H, are formed by the gap materials 34 contained therein. In this case, by adjusting the ejection amount of the curable material and the particle size of the gap material 34, the height H can be set. That is, the number of the gap materials 34 that can be contained in the curable material is uniquely determined based on the ejection amount of the curable material and the particle size of the gap material 34. By adjusting both the ejection amount and the particle size, the height H of each of the support bodies 33 can be set precisely. Subsequently, when the curable material is an ultraviolet curable material, ultraviolet rays are irradiated onto the support bodies 33. Alternatively, when the curable material is a thermosetting material, heat irradiation is performed on the support bodies 33. Then, the curable material is cured.

In the present example, since the gap materials 34 are mixed in the curable material so as to form the support bodies 33, the height H of each of the support bodies 33 can be suitably set according to the relationship between the ejection amount of the curable material and the particle size of the gap material 34.

Further, since the gap materials 34 are mixed in the curable material, the solid support bodies 33 can be formed. In addition, like the first example, the support bodies 33 each having the extremely small diameter d (for example, about 0.1 to 5 mm) can be formed, as compared to the case in which drawing is performed with the dispenser or the like. Therefore, the support bodies 33 can be easily formed on the outer circumference of the lens glass substrate 20 and near the boundary between adjacent chip substrate regions 200. As a result, like the first example, incident light, which is reflected or shielded by the light-shielding layer 23 to be lost, can be efficiently condensed to the openings of the pixels and thus the amount of transmitted light can be further increased.

THIRD EXAMPLE

A third example of the unit that draws the support bodies 33 on the lens glass substrate 20 in the form of dots will be specifically described with reference to FIGS. 6A to 6C.

In the above-described second example, the liquid, which is obtained by mixing the gap materials 34 in the curable material, is ejected from the liquid droplet ejection device main body 300 so as to form the support bodies 33 on the lens glass substrate 20. In the present example, the gap materials 34 are sprayed on the lens glass substrate 20 in advance and then the support bodies 33 are drawn on the lens glass substrate 20 in the form of dots by the curable material ejected from the liquid droplet ejection device main body 300. Therefore, only the curable material, which is diluted by the solution, is ejected from the liquid droplet ejection device main body 300.

Figure 6A:
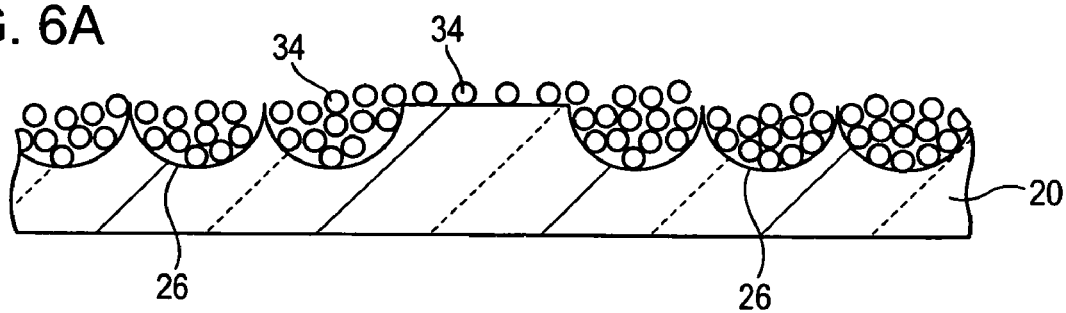
FIG. 6A is an expanded cross-sectional view showing essential parts by process according to a third example in the first embodiment of the invention.

According to such a configuration, first, as shown in FIG. 6A, the gap materials 34 are sprayed on the overall lens glass substrate 20. When the nature of the curable material, such as viscosity or the like, is constant, the particle size of the gap material 34 is determined by the previously set height H of each of the support bodies 33.

Figure 6B:
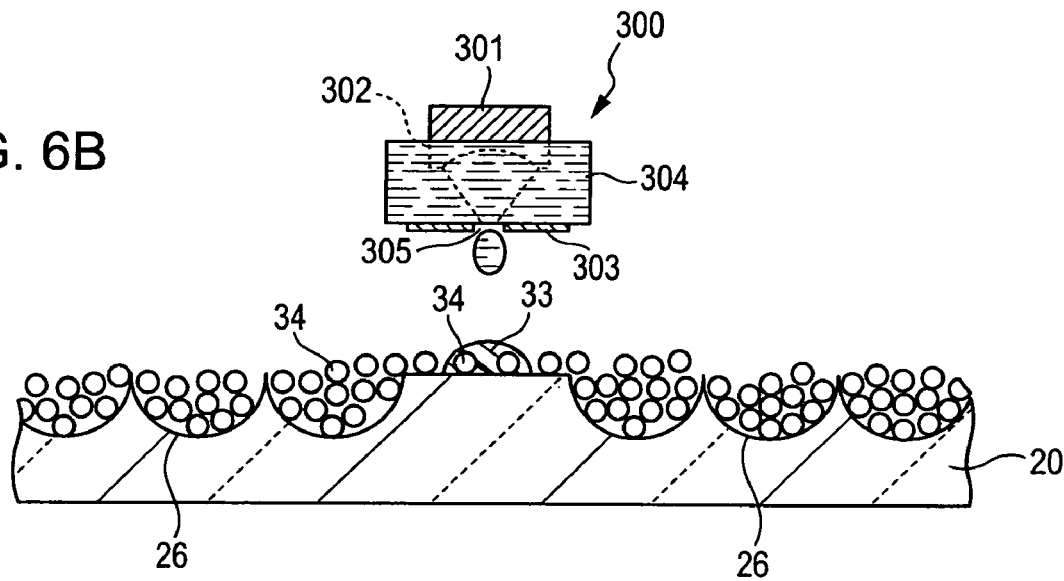
FIG. 6B is an expanded cross-sectional view showing essential parts by process according to the third example in the first embodiment of the invention.

Next, as shown in FIG. 6B, the set amount of the curable material is ejected and drawn in the dot shape at the predetermined location of the lens glass substrate 20 (near the boundary between adjacent chip substrate regions 200 (see FIG. 3) and, if necessary, on the outer circumference of the lens glass substrate 20) from the ejection slot 305 of the liquid droplet ejection device main body 300. Then, the gap materials 34 disposed at the corresponding location are incorporated by the curable material.

Subsequently, the solution contained in the curable material, into which the gap materials 34 are incorporated, is volatilized, and thus the support bodies 33, each having the height H, are formed.

The height H of each of the support bodies 33 can be adjusted by the ejection amount of the curable material and the particle size of the gap material 34. That is, the number of the gap materials 34 incorporated into the curable material is uniquely determined based on the ejection amount of the curable material and the particle size of the gap material. By adjusting both the ejection amount and the particle size, the height H can be set precisely.

Subsequently, when the curable material is an ultraviolet curable material, ultraviolet rays are irradiated onto the support bodies 33. Alternatively, when the curable material is a thermosetting material, heat irradiation is performed on the support bodies 33. Then, the curable material is cured.

Figure 6C:
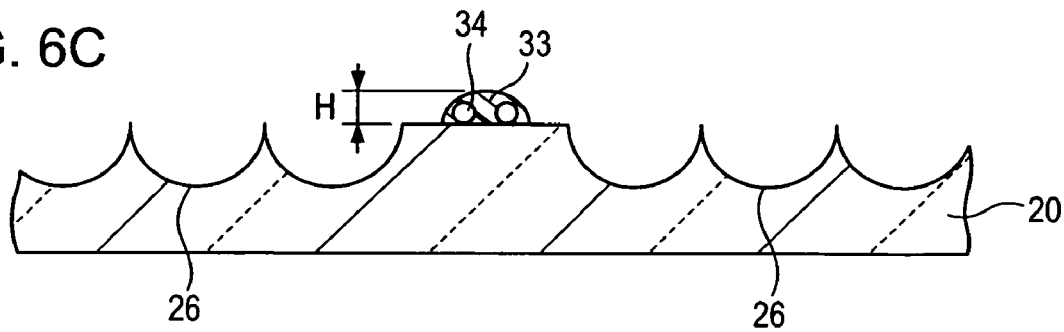
FIG. 6C is an expanded cross-sectional view showing essential parts by process according to the third example in the first embodiment of the invention.

Next, as shown in FIG. 6C, unnecessary gap materials 34, which are not incorporated into the curable material, are removed. As a unit for removing the unnecessary gap materials 34, air blowing, washing, dissolving by a medicinal liquid, etching, or the like may be exemplified.

In the present example, the gap materials 34 are mixed in the curable material so as to form the support bodies 33. Therefore, the height H of each of the support bodies 33 can be suitably set according to the relationship between the ejection amount of the curable material and the particle size of the gap material 34.

Further, since the gap materials 34 are sprayed in advance, only the curable material, which is diluted by the solution, may be ejected from the liquid droplet ejection device main body 300. Further, the configuration of the liquid droplet ejection device main body 300 can be simplified, without providing the part for vibrating the gap materials 34 at the resonance point described in the second example.

Further, since the gap materials 34 are mixed in the curable material, the solid support bodies 33 can be formed. In addition, like the first embodiment, the support bodies 33 each having the extremely small diameter d (for example, about 0.1 to 5 mm) can be formed, as compared to the case in which drawing is performed with the dispenser or the like. Therefore, the support bodies 33 can be easily formed on the outer circumference of the lens glass substrate 20 and near the boundary between adjacent chip substrate regions 200. As a result, like the first example, incident light, which is reflected or shielded by the light-shielding layer 23 to be lost, can be efficiently condensed to the openings of the pixels and thus the amount of transmitted light can be further increased.

Second Embodiment

Figure 8:
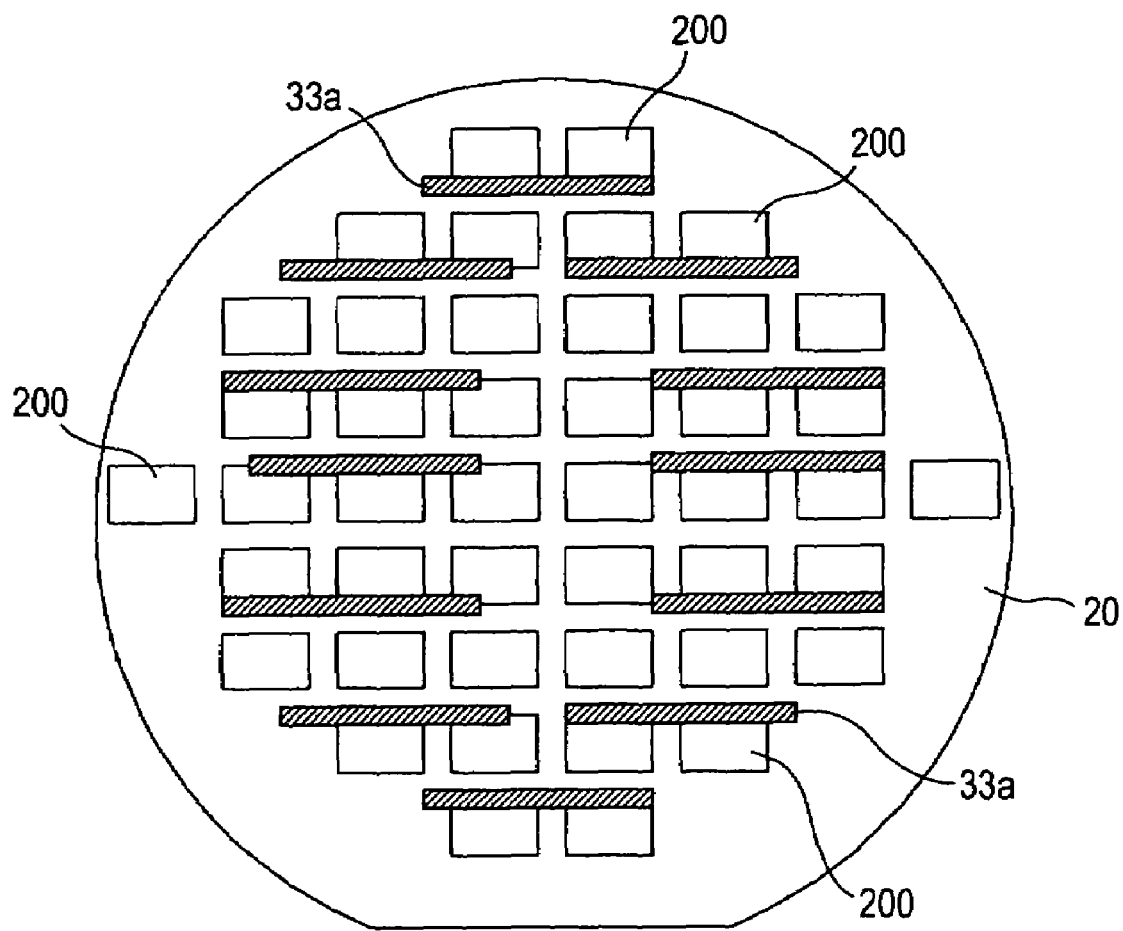
FIG. 8 is a plan view showing a state in which support bodies are drawn on a lens glass substrate according to a second embodiment of the invention.

FIG. 8 is a plan view showing a state where the support bodies are drawn on a lens glass substrate according to a second embodiment of the invention, which corresponds to FIG. 3. The same parts as those in the first embodiment are represented by the same reference numerals and the descriptions thereof will be omitted.

The support bodies 33 used in the first embodiment are formed by the curable material ejected from the liquid droplet ejection device main body 300. Therefore, the support bodies 33 are formed in semicircular shapes by surface tension of the curable material. In the present embodiment, support bodies 33a are formed by continuously ejecting the curable material from the liquid droplet ejection device main body 300 (see FIG. 4 and FIGS. 6A to 6C) and by relatively moving the liquid droplet ejection device main body 300 and the lens glass substrate 20. If doing so, the support bodies 33*a* having bar shapes can be formed by linearly drawing the curable material near the boundary between adjacent chip substrate regions 200.

By forming the support bodies 33*a* in the bar shapes, the lens glass substrate 20 and the cover glass substrate 250 can be uniformly supported. Therefore, the thickness of the microlens layer 210 can be further made uniform.

Moreover, like the above-described first to third examples, the support bodies 33*a* may be made of only the curable material or may be made of the curable material in which the gap materials 34 are mixed. Further, the gap materials 34 may be sprayed and then the curable material may be drawn in the form of dots, thereby forming the support bodies 33.

Third Embodiment

Figure 9:
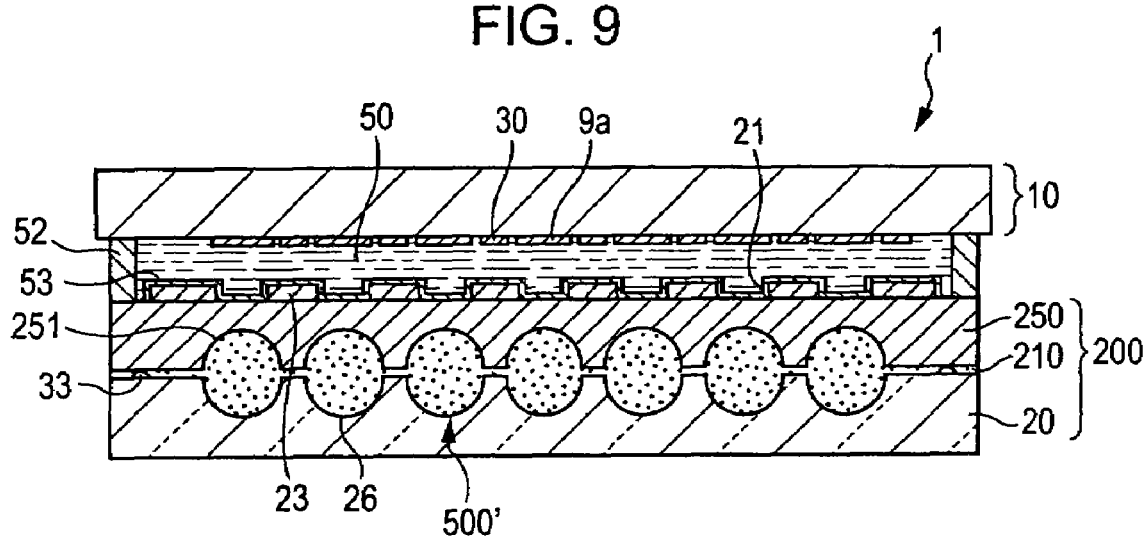
FIG. 9 is a cross-sectional view of a liquid crystal device according to a third embodiment of the invention.

FIG. 9 is a cross-sectional view of a liquid crystal device according to a third embodiment of the invention, which corresponds to FIG. 1. Moreover, the same parts as those in the first embodiment are represented by the same reference numerals and the descriptions thereof will be omitted.

The microlens 500 used in the first embodiment is a single-sides convex lens. On the contrary, in the present embodiment, a microlens 500 is a double-sides convex lens.

On a surface of the cover glass substrate 250 facing the lens glass substrate 20, concave portions 251 are formed to correspond to the concave portions 26 that are formed on the lens glass substrate 20. With both the concave portions 26 and 251, the double-sided convex microlenses 500' are formed in the microlens layer 210.

In the present embodiment, like the first embodiment, the support bodies 33 are formed between both glass substrates 20 and 250. Therefore, the distance between both glass substrates 20 and 250 can be made uniform, resulting in uniform lens performance of each of the double-sided convex microlenses 500' in the large substrate.

Fourth Embodiment

Figure 10:
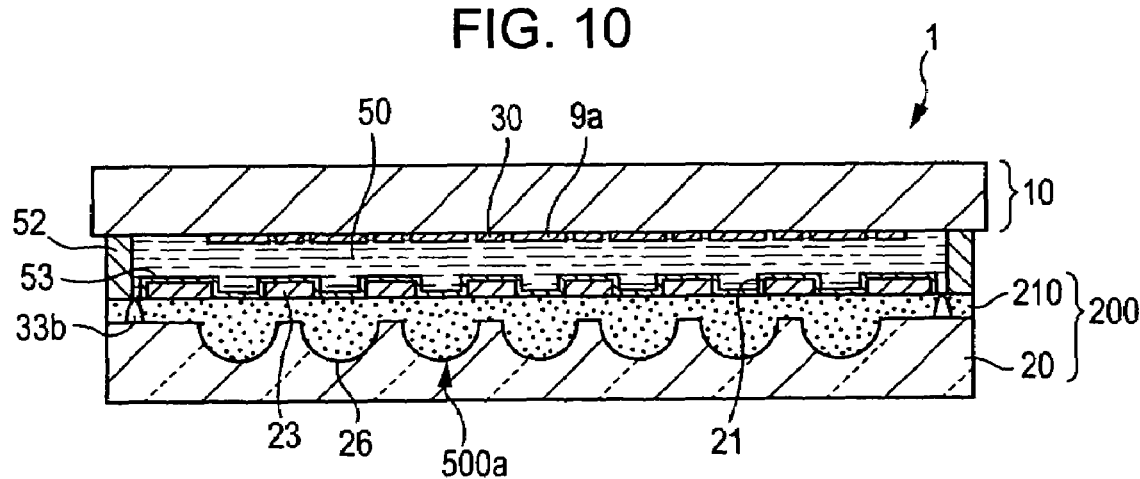
FIG. 10 is a cross-sectional view of a liquid crystal device according to a fourth embodiment of the invention.
Figure 11A:
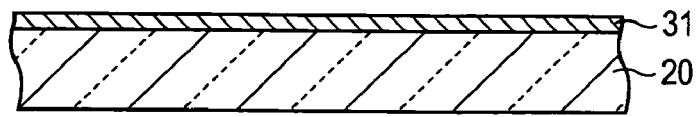
FIG. 11A is a process view showing a manufacturing method of a large substrate according to the fourth embodiment of the invention.
Figure 11B:
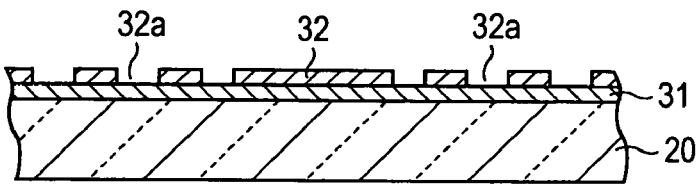
FIG. 11B is a process view showing the manufacturing method of the large substrate according to the fourth embodiment of the invention.
Figure 11C:
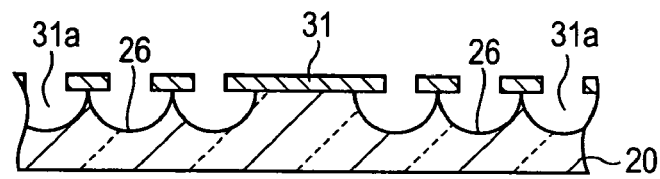
FIG. 11C is a process view showing the manufacturing method of the large substrate according to the fourth embodiment of the invention.
Figure 11D:
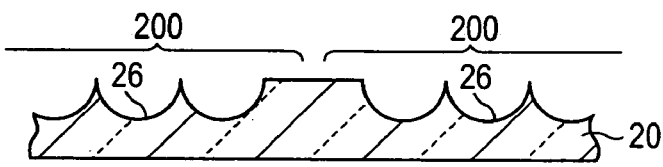
FIG. 11D is a process view showing the manufacturing method of the large substrate according to the fourth embodiment of the invention.
Figure 11E:
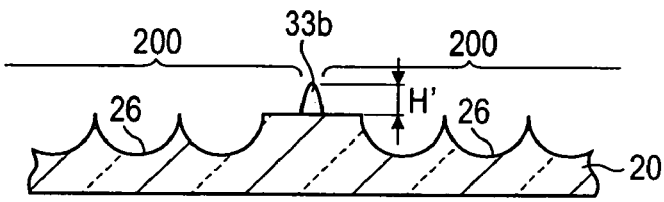
FIG. 11E is a process view showing the manufacturing method of the large substrate according to the fourth embodiment of the invention.
Figure 11F:
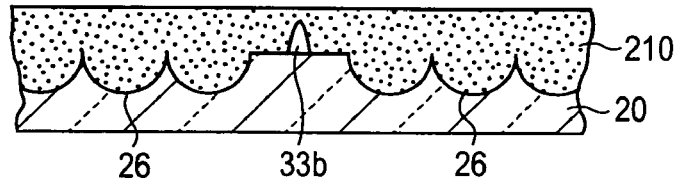
FIG. 11F is a process view showing the manufacturing method of the large substrate according to the fourth embodiment of the invention.
Figure 11G:
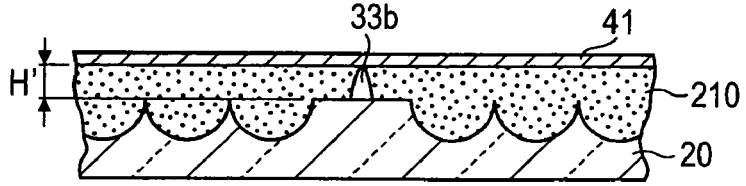
FIG. 11G is a process view showing the manufacturing method of the large substrate according to the fourth embodiment of the invention.
Figure 11H:
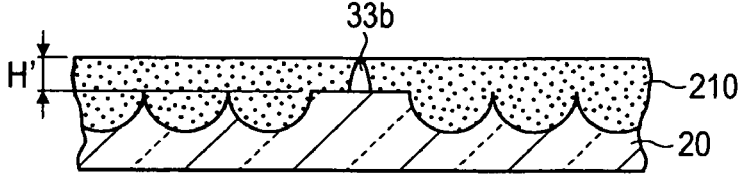
FIG. 11H is a process view showing the manufacturing method of the large substrate according to the fourth embodiment of the invention.
Figure 11I:
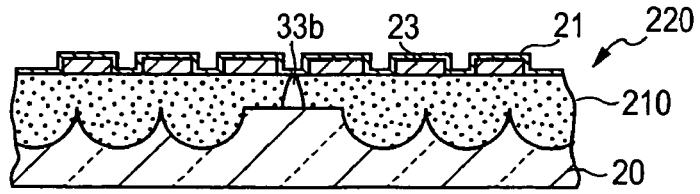
FIG. 11I is a process view showing the manufacturing method of the large substrate according to the fourth embodiment of the invention.

FIG. 10 is a cross-sectional view of a liquid crystal device according to a fourth embodiment of the invention, which corresponds to FIG. 1. Moreover, the same parts as those in the first embodiment are represented by the same reference numerals and the descriptions thereof will be omitted.

In the first embodiment, the cover glass substrate 250 is formed to face the lens glass substrate 20 via the microlens layer 210 and the microlenses 500 are constituted by the microlens layer 210 and the cover glass substrate 250. The present embodiment is different from the first embodiment in that microlenses 500*a* are constituted by only the microlens layer 210, without mounting the cover glass substrate 250, and the light-shielding layer 23 and the counter electrode 21 are directly formed on the upper surface of the microlens layer 210.

The cover glass substrate 250 is mounted on the surface of the microlens layer 210 in order to the secure the focus distance of each of the microlenses 500. Generally, the thickness of the cover glass substrate 250 is adjusted by physically grinding the surface thereof, such that the sum of the thickness of the microlens layer 210 and the thickness of the cover glass substrate 250 becomes the focus distance of each of the microlenses 500. However, the thickness of the cover glass substrate 250 may be hardly controlled through physical grinding and the precision of the thickness of each of the microlenses 500 to be processed may be lowered. Further, with grinding of the cover glass substrate 250, the surface thereof may be damaged or a minute unevenness may occur, such that the surface states of the microlenses 500 deteriorate. For this reason, the adhesiveness to the light-shielding layer 23 and the counter electrode 21, which are formed just on the microlenses 500, deteriorates.

In the present embodiment, the height of each of support bodies 33*b* is increased by the thickness of the cover glass substrate 250, as compared to the support bodes 33 in the first embodiment, thereby increasing the thickness of the microlens layer 210. Therefore, the thickness required for the focus distance of each of microlenses 500*a* can be sufficiently secured only with the microlens layer 210. Accordingly, the cover glass substrate 250 is not needed and thus low cost can be achieved. Further, by adjusting the height of each of the support bodies 33*b*, the thickness of each of the microlenses 500*a* is controlled, such that the precision of the thickness of each of the microlenses 500*a* to be processed can be enhanced. In addition, the surface of each of the microlenses 500*a* does not need to be physically grinded and thus the surface states of the microlenses 500*a* can be improved. Therefore, the adhesiveness to the light-shielding layer 23 and the counter electrode 21 to be formed just thereon can be enhanced.

Next, a manufacturing method of a counter substrate 200 in the present embodiment will be described with reference to process views of FIGS. 11A to 11I. FIGS. 11A to 11*i* are process views showing a manufacturing method of a large substrate according to the fourth embodiment of the invention, which corresponds to FIG. 2. Moreover, the processes of FIGS. 11A to 11D are the same as those of FIGS. 2A to 2D and the descriptions thereof will be omitted.

(e) The support bodies 33*b*, each having a height H', are drawn on the lens glass substrate 20 in the form of dots. The height H' of each of the support bodies 33*b* is higher than the height H of each of the support bodies 33 of the first embodiment by the thickness of the cover glass substrate 250, such that the microlens layer 210 has the sufficient thickness required for the focus distance of each of the microlenses 500*a*. For example, the height H' is about tens to hundreds μm. Like the first embodiment, as shown in FIG. 3, the support bodies 33 are drawn near the boundary between adjacent chip substrate regions 200 on the lens glass substrate 20 and, if necessary, on the outer circumference of the lens glass substrate 20 to be cured. Moreover, the unit for forming the support bodies 33*b* is the same as that in the first embodiment.

(f) An uncured transparent material (210) is coated on the lens glass substrate 20 in order to form the microlens layer 210. As the transparent material (210), a transparent inorganic material, SOG (Spin On Glass), a resin material, and the like may be exemplified. Further, the resin material includes an acryl-based resin, an epoxy-based resin, an acrylic epoxy-based resin, a vinyl-based resin, a thiourethane-based resin, and the like. In addition, an adhesive made of this material may be adopted.

In the present embodiment, a transparent resin having a high refractive index is adopted as the transparent material (210). The transparent material (210) is thicker than the height of each of the support bodies 33*b* and is coated to an extent that the support bodies 33*b* contain the transparent material (210).

(g) A pressing plate 41 is closely adhered and pressed to the entire upper surface of the transparent material (210) until the pressing plate 41 reaches the support bodies 33*b*. Moreover, the pressing plate 41 is a flat plate made of, for example, metal or quartz. A surface treatment is performed using a low frictional coefficient, such as a fluorocarbon resin or the like, such that the surface of the pressing plate 41 closely adhered to the transparent material (210) is easily separated from the transparent material (210) after pressing.

(h) In a state in which the pressing plate (41) is closely adhered to the transparent material (210), ultraviolet rays are irradiated onto the transparent material (210), such that the transparent material (210) is cured. If doing so, the height H' of the transparent material (210) becomes constant by the support bodies 33b that exist on the lens glass substrate 20 in the form of dots. Therefore, the microlens layer 210 is formed with the transparent material (210). After the transparent material (210) is completely cured, the pressing plate 41 is removed from the transparent material (210).

Moreover, the method of curing the resin is not limited to the ultraviolet curing method but may be suitably selected according to the kinds or functions of the resin. For example, when the thermosetting resin is adopted as the resin, the resin can be cured through heat irradiation.

(i) The light-shielding layer 23 and the counter electrode 21 are formed on the microlens layer 210, such that the large substrate 220 is completed.

In the present embodiment, by increasing the height H' of each of the support bodies 33b, the microlens layer 210 is thickened, such that the microlenses 500a are formed only with the microlens layer 210. Therefore, the cover glass substrate is not required and thus the light-shielding layer 23 and the counter electrode 21 are formed directly on the microlens layer 210.

Fifth Embodiment

Figure 12:
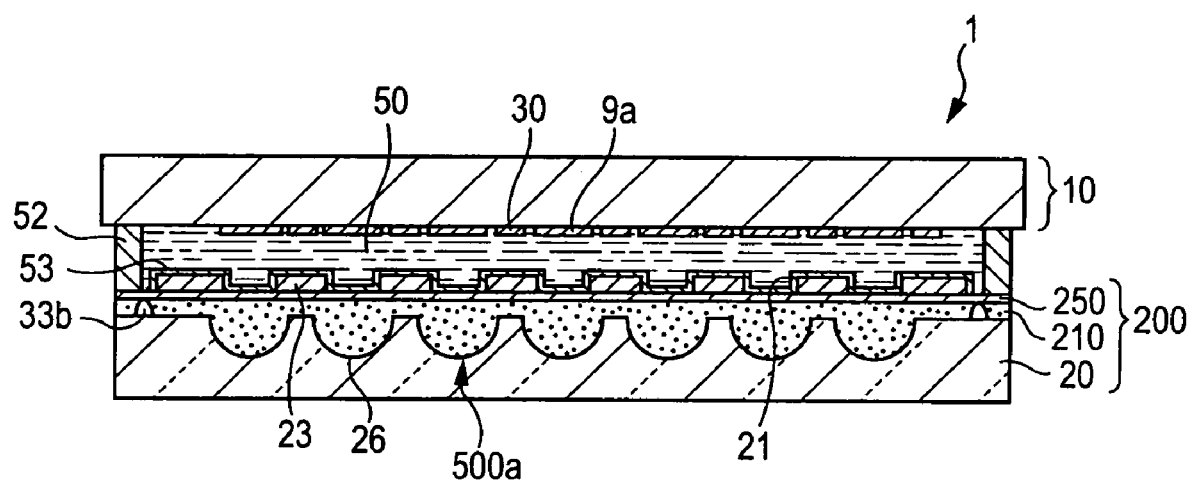
FIG. 12 is a cross-sectional view of a liquid crystal device according to a fifth embodiment of the invention.

FIG. 12 is a cross-sectional view of a liquid crystal device according to a fifth embodiment of the invention, which corresponds to FIG. 10. Moreover, the same parts as those in the fourth embodiment are represented by the same reference numerals and the descriptions thereof will be omitted.

In the fourth embodiment, the light-shielding layer 23 and the counter electrode 21 are formed directly on the microlens layer 210. The present embodiment is different from the fourth embodiment in that a protective film 260 is formed on the microlens layer 210 and the light-shielding layer 23 and the counter electrode 21 are formed on the protective film 260.

As the protective film 260, an inorganic glass film is preferably used. For example, a silicon oxide film, such as NSG, or the like, which is generated with an atmospheric pressure or reduced pressure CVD method or tetraethyl orthosilicate (TEOS) gas, and a glass film, which is generated by spin-coating SOG (Spin On Glass), are used.

In the present embodiment, the protective film 260 is provided on the microlens layer 210, and thus the adhesiveness between the light-shielding layer 23 and the counter electrode 21, and the microlens layer 210 can be enhanced.

Moreover, the invention is not limited to the above-described embodiments. For example, the support bodies 33 and 33a may be formed on the cover glass substrate 250.

Further, the manufacturing method and the structures of the bar-like support bodies 33a described in the second embodiment can be applied to the sealing material 52 as they are. With the application of this technique, the height of the sealing material 52 can be constant. Therefore, in this case, the sealing material 52 serves as the support bodies of the invention.

(Projection-Type Display Device)

Figure 13:
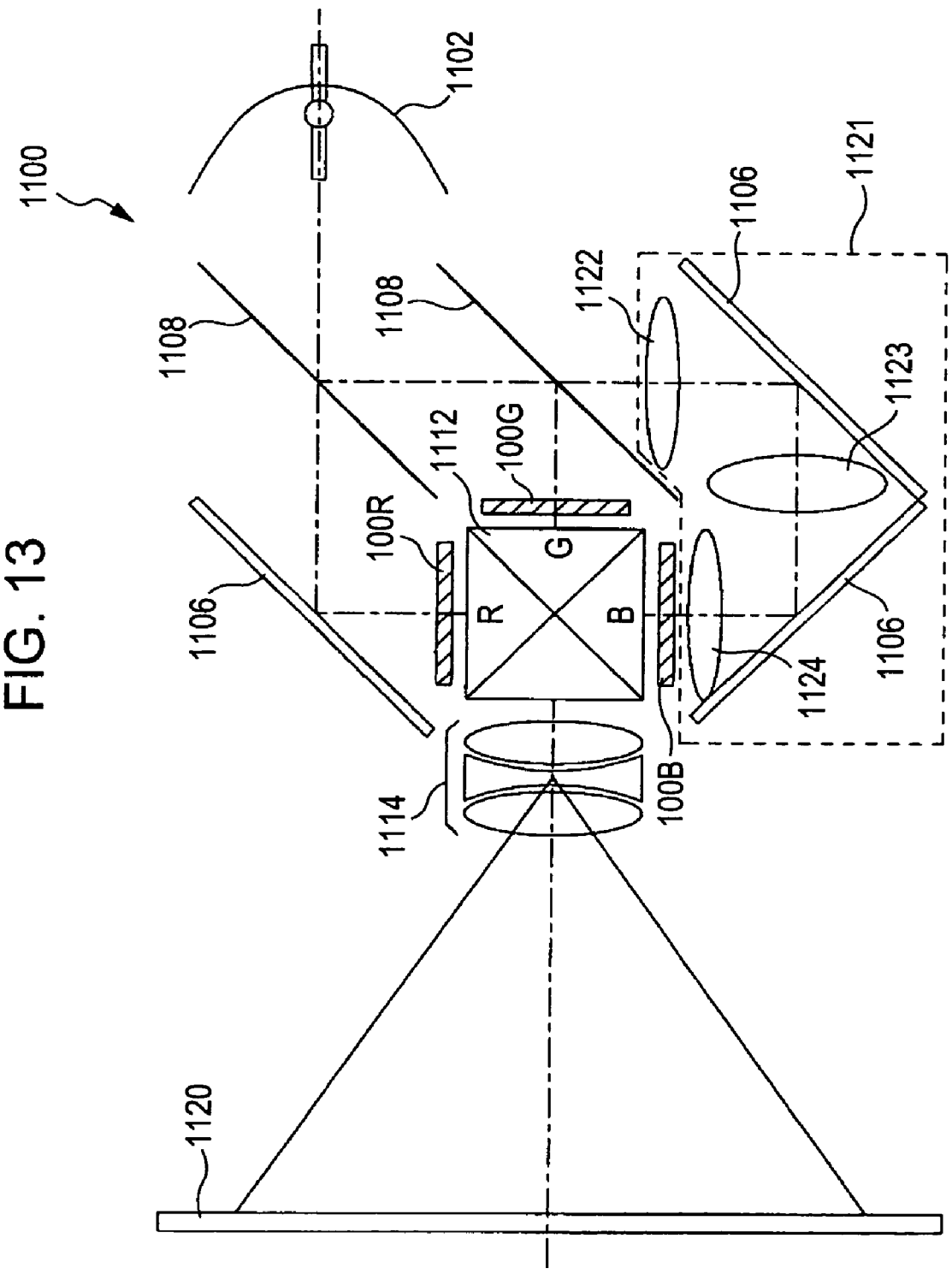
FIG. 13 is a diagram schematically showing the configuration of essential parts of a projection-type display device in which a liquid crystal device is used as a light valve.

FIG. 13 shows an aspect in which a liquid crystal device is used as a light valve of a projection-type display device.

In FIG. 13, reference numeral 1100 denotes a projection-type display device as an electronic apparatus. The projection-type display device is a projector in which three liquid crystal modules including the liquid crystal device that has a driving circuit mounted on a TFT substrate are prepared and used as light valves 100R, 100G, and 100B for RGB, respectively.

In the projection-type display device 1100, projection light emitted from a lamp unit 1102 having a white light source, such as a metal halide lamp or the like, is separated into light components R, G, and B corresponding to three primary colors of RGB by means of three mirrors 1106 and two dichroic mirrors 1108. The separated light components R, G, and B are guided to on the light valves 100R, 100G, and 100B corresponding to the respective colors. At this time, in particular, the light component B is guided through a relay lens system 1121, which has an incident lens 1122, a relay lens 1123, and an emitting lens 1124, in order to prevent optical loss due to a long optical path.

Then, the light components corresponding to three primary colors modulated by the light valves 100R, 100G, and 100B are combined by a dichroic prism 1112 again and then projected as a color image on a screen 1120 through a projection lens 1114.

An electro-optical device of the invention may be a passive-matrix-type liquid crystal device, or a liquid crystal device having thin film diodes (TFDS) as switching elements, in addition to the liquid crystal device using the TFT active matrix driving method. Further, the invention is not limited to the liquid crystal device but can be applied to various electro-optical devices, such as an electroluminescent device, an organic electroluminescent device, a plasma display device, an electrophoretic display device, a device using electron emission elements (Field Emission Display and Surface-Conduction Electron-Emitter Display), DLP (Digital Light Processing) or DMD (Digital Micromirror Device), and the like.

What is claimed is:

1. An electro-optical device comprising:
   first and second substrates that face each other;
   support bodies that are interposed between both substrates so as to define a gap between both substrates, the support bodies being formed on one of the substrates; and
   a microlens layer that is formed between both substrates,
   wherein the first substrate is a lens substrate that has a plurality of concave portions and the second substrate is a cover substrate that faces the first substrate, and
   a thickness of the micro lens layer is defined by the support bodies, the support bodies being made of only a curable material and having a semicircular shape in cross-section within the microlens layer.

2. The electro-optical device according to claim 1, wherein the support bodies are made of a curable material ejected from a liquid droplet ejection unit.

3. The electro-optical device according to claim 1, wherein gap materials that define a distance between both substrates are mixed in the supporting bodies.

4. An electronic apparatus comprising the electro-optical device according to claim 1.

5. An electro-optical device comprising:
   a first substrate;
   support bodies that are formed on the first substrate, the support bodies being made of only a curable material and having a semicircular shape; and
   a transparent material layer that is formed to reach the same height as each support body on the first substrate.

6. The electro-optical device according to claim 5,
   wherein the first substrate is a lens glass substrate that has a plurality of concave portions, the transparent material layer is a microlens layer that has a refractive index different from that of the lens glass substrate, and a thickness of the microlens layer is defined by the support bodies.

7. The electro-optical device according to claim 5, further comprising:

a protective film that is formed on the surface of the transparent material layer.

8. The electro-optical device according to claim 5, wherein a gap material that defines the thickness of the transparent material layer is mixed in the support bodies.

9. The electro-optical device according to claim 5, wherein the transparent material layer is made of a transparent resin.

* * * * *